US008957298B2

(12) United States Patent
Orem

(10) Patent No.: US 8,957,298 B2
(45) Date of Patent: *Feb. 17, 2015

(54) APPARATUS, SYSTEMS AND METHODS FOR ELECTRICAL POWER GENERATION FROM HEAT

(76) Inventor: Peter Milon Orem, Renton, WA (US)

(*) Notice: Subject to any disclaimer, the term of this patent is extended or adjusted under 35 U.S.C. 154(b) by 252 days.

This patent is subject to a terminal disclaimer.

(21) Appl. No.: 13/397,404

(22) Filed: Feb. 15, 2012

(65) Prior Publication Data

US 2012/0145213 A1 Jun. 14, 2012

Related U.S. Application Data

(63) Continuation-in-part of application No. 13/229,339, filed on Sep. 9, 2011, now Pat. No. 8,624,100.

(60) Provisional application No. 61/381,984, filed on Sep. 11, 2010, provisional application No. 61/443,151, filed on Feb. 15, 2011.

(51) Int. Cl.
H01L 35/30 (2006.01)
H01L 35/32 (2006.01)
(Continued)

(52) U.S. Cl.
CPC . H01L 35/30 (2013.01); B60L 8/00 (2013.01); H01L 35/16 (2013.01); Y02T 10/7083 (2013.01)
USPC .......... 136/205; 136/201; 136/236.1

(58) Field of Classification Search
CPC ....................................... H01L 35/10
USPC .................. 136/200, 201, 205, 206
See application file for complete search history.

(56) References Cited

U.S. PATENT DOCUMENTS 3,186,873 A 6/1965 Dunlap
4,004,210 A 1/1977 Yater
(Continued)

FOREIGN PATENT DOCUMENTS

WO WO 2010073391 A1 * 7/2010 .............. H01L 35/26

OTHER PUBLICATIONS

Huang, Robin K. et al., "Heterojunction Thermophotovoltaic Devices with High Voltage Factor," Journal of Applied Physics, 101 / 046102, Published online Feb. 16, 2007.
(Continued)

Primary Examiner — Jonathan Johnson
Assistant Examiner — Bethany L Martin
(74) Attorney, Agent, or Firm — Lowe Graham Jones PLLC

(57) ABSTRACT

Systems and methods are operable to generate electric power from heat. Embodiments employ one or more direct thermal electric converters that have at least a first recombination material having a first recombination rate, a second recombination material adjacent to the first recombination material and having a second recombination rate, wherein the second recombination rate is different from the first recombination rate, and a third recombination material adjacent to the second recombination material and having a third recombination rate substantially the same as the first recombination rate. Application of heat generates at least first charge carriers that migrate between the first recombination material and the second recombination material, and generates at least second charge carriers that migrate between the third recombination material and the second recombination material. The migration of the first charge carriers and the migration of the second charge carriers generates an electrical current.

6 Claims, 6 Drawing Sheets

(51) Int. Cl.
*H01L 35/12* (2006.01)
*B60L 8/00* (2006.01)
*H01L 35/16* (2006.01)

(56) References Cited

U.S. PATENT DOCUMENTS

| | | |
|---|---|---|
| RE33,584 E | 5/1991 | Mimura |
| 5,068,524 A | 11/1991 | Elliot et al. |
| 5,449,561 A | 9/1995 | Golding et al. |
| 5,470,395 A | 11/1995 | Yater et al. |
| 6,580,027 B2 | 6/2003 | Forrest et al. |
| 6,774,300 B2 | 8/2004 | McFarland |
| 6,940,637 B2 | 9/2005 | Toney |
| 2005/0056864 A1 | 3/2005 | Pan |
| 2011/0284049 A1* | 11/2011 | Iwai ............................ 136/240 |

OTHER PUBLICATIONS

Dr. R.W. Graeff, "Gravity Machine, My Search for Peaceful Energy," Apr. 22, 2002, Web site: www.firstgravitymachine.com.

* cited by examiner

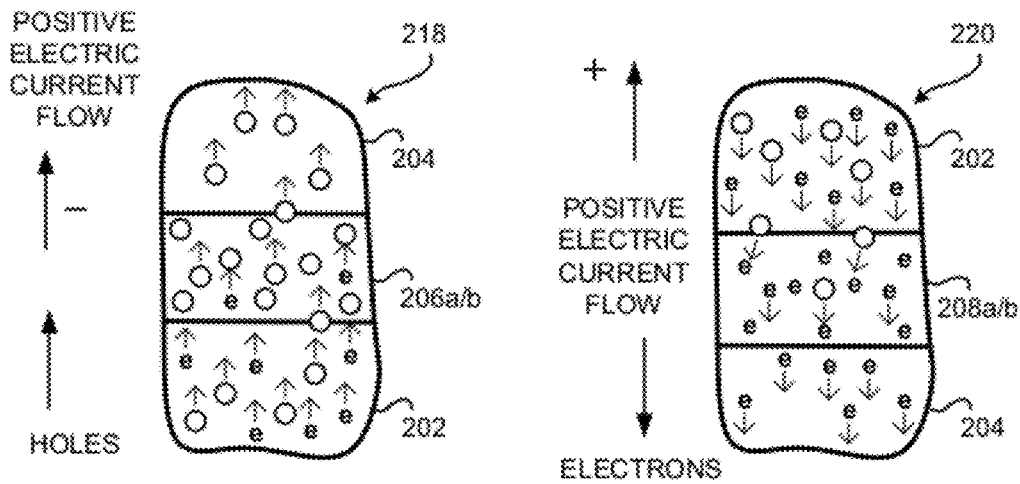
FIG. 3
FIG. 4
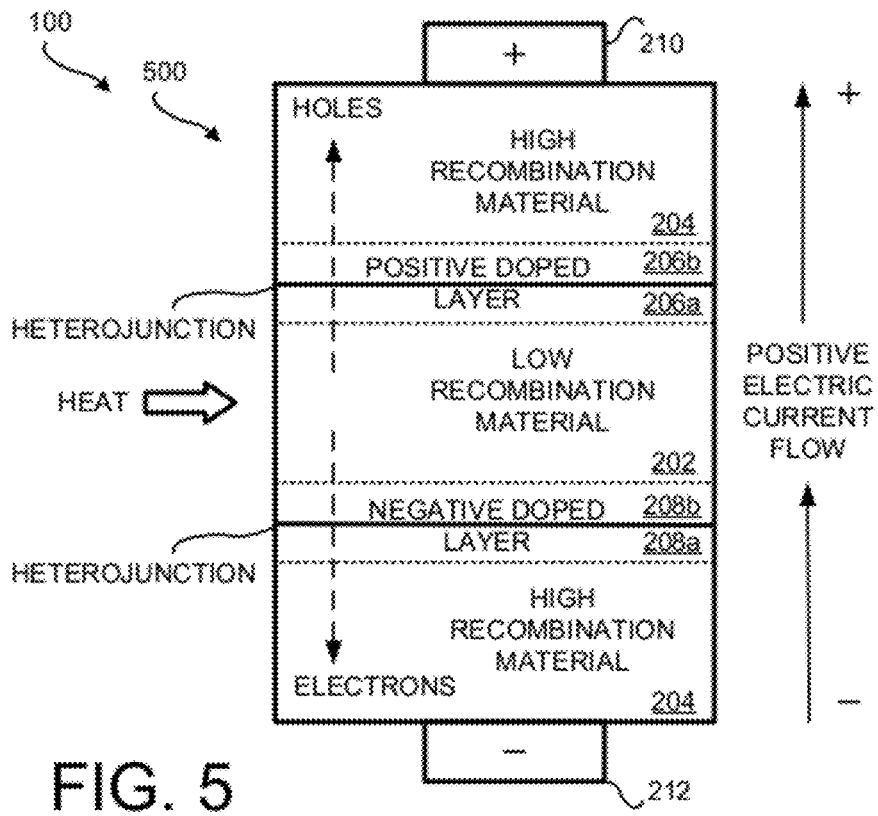
FIG. 5

APPARATUS, SYSTEMS AND METHODS FOR ELECTRICAL POWER GENERATION FROM HEAT

PRIORITY CLAIM

This application is a Continuation-in-Part of U.S. Utility Application entitled "Apparatus, Systems and Methods For Electrical Power Generation From Heat," having application Ser. No. 13/229,339, filed on Sep. 9, 2011, which claims priority to U.S. Provisional Application entitled "Useful Electrical Power from Thermally Generated Carrier Pairs," having Application Ser. No. 61/381,984, filed Sep. 11, 2010. This application further claims the benefit of and priority to U.S. Provisional Application entitled "Power Generation and Storage Utilizing Direct Thermoelectric Conversion," having Application Ser. No. 61/443,151, filed Feb. 15, 2011. Accordingly, the present application claims priority to and the benefit of the filing dates of U.S. application Ser. No. 13/229,339, Provisional Application Ser. No. 61/381,984, and Provisional Application Ser. No. 61/443,151, which are all incorporated by reference herein in their entirety.

BACKGROUND

Heat is a readily available source of energy. Heat may be available from ambient sources, such as the atmosphere, flowing water, the sun, or geothermal fluids. Heat may also be a byproduct of a process such as steam-powered electrical generation, or industrial manufacturing, operating semiconductor devices, or the like.

However, it has been difficult to convert available heat energy into electrical power. For example, heat may be used to generate power using a secondary fluid, such as steam or the like, which drives a generator turbine.

Often, such as at electrical power generation stations and industrial manufacturing facilities, heat is considered as a waste byproduct that must be eliminated. When heat is a waste byproduct, for example, the waste heat is dissipated into the atmosphere using cooling towers or the like.

Accordingly, at least to improve thermal efficiency and perhaps to reduce systems complexity, there is a need in the arts to derive electrical power from available heat.

SUMMARY

Systems and methods of direct thermal electric conversion are disclosed.

BRIEF DESCRIPTION OF THE DRAWINGS

Preferred and alternative embodiments are described in detail below with reference to the following drawings:

FIG. 3 conceptually illustrates migration of mobile charge carriers from the low recombination material into the positive doped layer, and then the attendant migration of holes from the positive doped layer into the high recombination material;

FIG. 4 conceptually illustrates migration of mobile charge carriers from the low recombination material into the negative doped layer, and then the attendant migration of electrons from the negative doped layer into the high recombination material;

FIG. 5 is a block diagram of an alternative semiconductor embodiment of the direct thermal electric converter;

DETAILED DESCRIPTION

Figure 1:
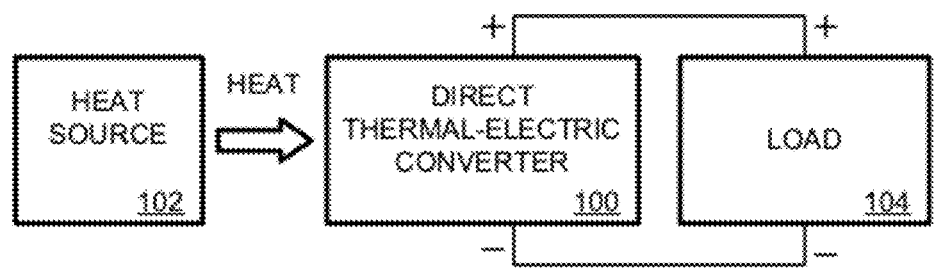
FIG. 1 is a block diagram of an embodiment of a direct thermal electric converter.

FIG. 1 is a block diagram of an embodiment of a direct thermal electric converter (DTEC) 100. Embodiments of the direct thermal electric converter 100 are configured to receive heat from a heat source 102, and are configured to generate electrical power from the received heat. The electrical power (current and voltage) is deliverable to a load 104. In some embodiments, the generated electrical power is output in a direct current (DC) form. In other embodiments which include power condition equipment, the generated electrical power may be output in an alternating current (AC) form.

The various semiconductor embodiments are configured to capture the "built-in" potential ($V_D$) of diodes by pitting the depletion regions of different materials against each other. The overall formula for carrier densities in semiconductors is demonstrated in Equation 1.

$$n^*p = C^*T^3 e^{(-Eg/kb^*T)} \quad (1)$$

In Equation 1, n and p are electron and hole concentrations respectively, C is a material-specific constant, T is temperature (in Kelvins), Eg is the bandgap, and kb is Boltzmann's Constant. At ambient, $kb^*T$ is approximately 0.025 eV.

Figure 2:
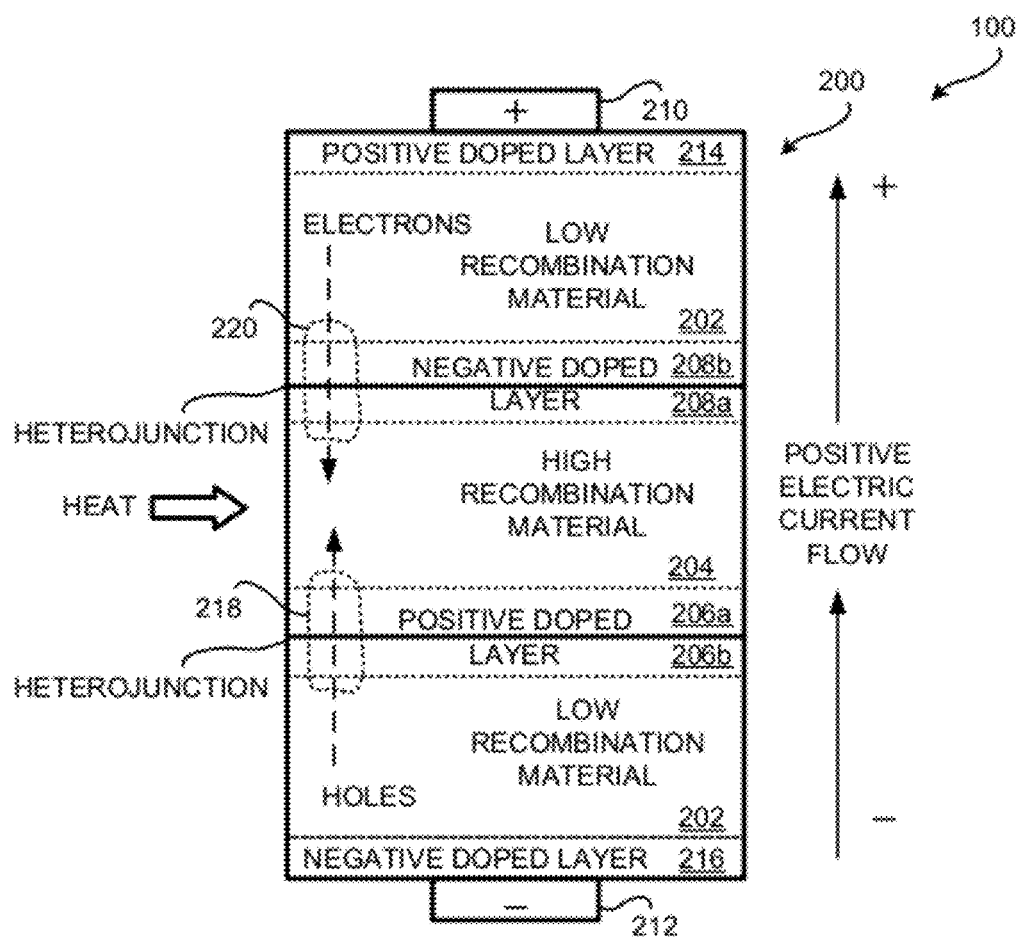
FIG. 2 is a block diagram of an exemplary semiconductor embodiment of the direct thermal electric converter.

FIG. 2 is a block diagram of an exemplary semiconductor embodiment 200 of the direct thermal electric converter (DTEC) 100. The exemplary semiconductor embodiment 200 comprises alternating layers of a low recombination material 202 (interchangeably referred to as a low recombination semiconductor material) and a high recombination material 204 (interchangeably referred to as a high recombination semiconductor material). The low recombination material 202 and the high recombination material 204 join at a heterojunction.

The high recombination material 204 may be doped with a positive doping material to form a positive doped layer 206a at one end and adjacent to the heterojunction. The high recombination material 204 may doped with a negative doping material to form a negative doped layer 208a at the other end and adjacent to the other heterojunction. Accordingly, a layer of high recombination material 204 remains that is not doped (and is thus on opposing sides of the positive doped layer 206a and the negative doped layer 208a).

The low recombination material 202 may also be doped with a positive doping material to form a positive doped layer 206b at one end and adjacent to the heterojunction. The low recombination material 202 may also be doped with a negative doping material to form a negative doped layer 208b at the other end and adjacent to the another heterojunction. Accordingly, a layer of low recombination material 202 remains that is not doped.

As illustrated in FIG. 2, the high recombination material 204 and the low recombination material 202 are separated by either a positive doped layer 206a/b or a negative doped layer 208a/b. Electrons may migrate across the heterojunction through the negative doped layer 208a/b. Holes may migrate across the heterojunction through the positive doped layer 206a/b. Electron and/or hole drift, diffusion, and thermionic emission (indicating crossing the heterojunction) may be interchangeably used for the term "migrate" herein.

A positive terminal 210 and a negative terminal 212 provide attachment points (a Schottky contact or the like) for delivery of the generated DC electric power. In alternative embodiments, an optional positive doped layer 214 and/or an optional negative doped layer 216 may be included at the ends of the low recombination material 202 and/or the high recombination material 204, respectively, to provide an ohmic type contact with the terminals 210, 212.

Any suitable low recombination material 202 and high recombination material 204 may be used. Any suitable doping material type, doping layer depth, and/or impurity concentration may be used in the various embodiments. In some embodiments, different doping materials may be used.

The low recombination material 202, the high recombination material 204, the positive doped layer 206a/b, and the negative doped layer 208a/b are semiconductor type materials wherein the bandgap between the conduction band and the valence band is relatively small (as compared to an insulator type material). In the high recombination material 204, electrons and holes may more easily recombine, or may be annihilated, as compared to the low recombination material 202. Since the rate at which electrons and holes recombine is inversely proportional to the electron and hole concentrations in the conduction and valence bands, respectively, the low recombination material 202 has relatively more free electrons and holes at any given temperature as compared to the high recombination material 204. Accordingly, there are a relatively greater number of free electrons and holes that are available to migrate from the low recombination material 202 (as compared to the high recombination material 204). Various embodiments may be created using selected materials with relatively high and low recombination rates of interest to achieve desired current and/or voltage in a semiconductor embodiment 200.

When heat energy is applied or transmitted into the semiconductor materials 202, 204, 206a/b, and/or 208a/b, mobile charge carriers (electrons) are able to migrate from their valence band up to their respective conduction band. Once the electron migrates to its conduction band, the electron may readily move to conduction bands of adjacent atoms or molecules. The associated hole created by the electron is also a mobile charge carrier that may readily migrate to adjacent atoms or molecules.

The mobile charge carriers (electron) of the low recombination material 202 tend to remain in the conduction bands due to the inherent nature of the low recombination material 202 which tends to resist recombination of the electron and hole pairs. Thus, it is relatively easy for the mobile charge carriers of the low recombination material 202 to migrate to other conduction bands of adjacent atoms or molecules.

In contrast, the electrons and/or holes that have migrated into the high recombination material 204 tend to recombine. Electron mobile charge carriers drop out of the conduction bands into available holes of the valence bands due to the inherent nature of the high recombination material 204 which tends to facilitate recombination of the electrons and/or holes. That is, it is relatively easy for the electrons in the conduction band to recombine with the holes of the valence bands.

The migration of mobile charge carriers (electrons and/or holes) may be directed, guided, limited and/or constrained in a manner that induces (generates) an aggregate electric current flow and an attendant voltage in the semiconductor embodiment 200 of the direct thermal electric converter 100. The current and voltage available at the terminals 210, 212 may then be provided to a load 104 (FIG. 1).

FIG. 3 shows a portion 214 of the semiconductor embodiment 200 that conceptually illustrates migration of mobile charge carriers (electrons and holes) from the low recombination material 202 into the positive doped layer 206a/b, and then the attendant migration of holes from the positive doped layer 206a/b into the high recombination material 204. FIG. 4 shows a portion 216 of the semiconductor embodiment 200 conceptually illustrates migration of mobile charge carriers (electrons and holes) from the low recombination material 202 into the negative doped layer 208a/b, and then the attendant migration of electrons from the negative doped layer 208a/b into the high recombination material 204. Holes are conceptually illustrated as a "o" and electrons are conceptually illustrated as an "e" in FIGS. 3 and 4. The holes are opposite in polarity from the electrons.

The positive doped layer 206a/b is a semiconductor layer fabricated with impurities that result in a relatively large number of holes in the positive doped layer 206a/b. As conceptually illustrated in FIG. 3, when the mobile charge carriers (electrons and/or holes) from an adjacent low recombination material 202 migrate into the positive doped layer 206a/b, the migrating electrons tend to be repelled or recombine with the holes of the positive doped layer 206a/b, respectively. However, the migrating holes from the low recombination material 202 tend to migrate through the positive doped layer 206a/b into the high recombination material 204. This net movement of holes from the low recombination material 202, through the positive doped layer 206a/b, and then the into the high recombination material 204 results in a generated current and voltage.

The negative doped layer 208a/b is fabricated with impurities that result in a relatively large number of electrons in the negative doped layer 208a/b. As conceptually illustrated in FIG. 4, when the mobile charge carriers (electrons and/or holes) from an adjacent low recombination material 202 migrate into the negative doped layer 208a/b, the migrating holes tend to be repelled or recombine with the electrons of the negative doped layer 208a/b, respectively. However, the migrating electrons from the low recombination material 202 tend to migrate through the negative doped layer 208a/b into the high recombination material 204. This net movement of electrons from the low recombination material 202, through the negative doped layer 208a/b, and then the into the high recombination material 204 results in a generated current and voltage.

The holes migrating through the positive doped layer 206a/b into the high recombination material 204 tend to combine with the electrons migrating through the negative doped layer 208a/b into the high recombination material 204. As the electrons and holes recombine in the high recombination material 204, additional mobile charge carriers (electrons and/or holes) tend to further migrate into the high recombination material 204. The continual migration of the mobile charge carriers tends into the high recombination material 204 results in a sustainable generated current and voltage so long as sufficient heat energy is available in the low recombination material 202 to generate mobile charge carriers and a load is present to absorb the current. If no load is present, a maximum open circuit voltage will be reached, reducing the net migration to zero.

FIG. 5 is a block diagram of an alternative semiconductor embodiment 500 of the direct thermal electric converter 100. The semiconductor embodiment 500 comprises alternating layers of a high recombination material 204 and a low recombination material 202 which are separated by either a positive doped layer 206a/b or a negative doped layer 208a/b. A positive terminal 210 and a negative terminal 212 provide attachment points for delivery of the generated DC electrical power. In alternative embodiments, a positive doped layer and/or a negative doped layer (not shown) may be optionally included at the ends of the semiconductor embodiment 500 depending upon the material recombination type of the ending portions of the semiconductor materials.

Figures 6, 7:
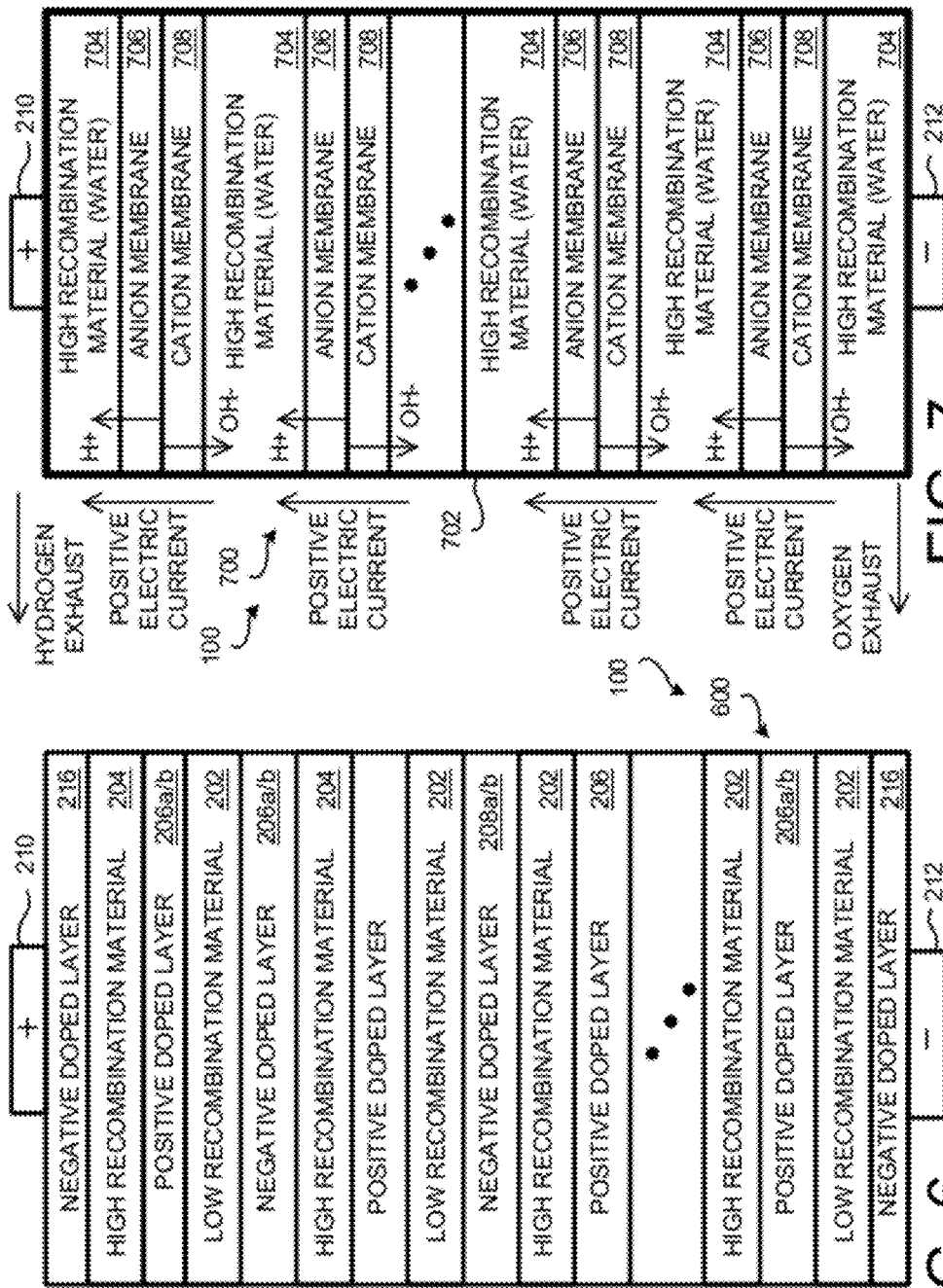
FIG. 6 is a block diagram of an alternative semiconductor embodiment of the direct thermal electric converter.
FIG. 7 is a block diagram of an electrochemical embodiment of the direct thermal electric converter.

FIG. 6 is a block diagram of an alternative semiconductor embodiment 600 of the direct thermal electric converter 100. The semiconductor embodiment 600 comprises a plurality of alternating layers of a high recombination material 204 and plurality of a low recombination material 202 which are separated by either a positive doped layer 206a/b or a negative doped layer 208a/b. A positive terminal 210 and a negative terminal 212 provide attachment points for delivery of the generated DC electrical power. In alternative embodiments, a positive doped layer 214 and/or a negative doped layer 216 may be optionally included at the ends of the semiconductor embodiment 200 depending upon the material recombination type of the ending portions of the semiconductor materials.

The plurality of layers of alternating high recombination material 204 and low recombination material 202 permit generation of a higher voltage and/or current at the terminals 210, 212. Accordingly, the design and fabrication of the semiconductor embodiment 500 may be engineered to provide any suitable voltage and/or current of interest. Either material may be used at a terminal, without regard to the material used at the opposite terminal.

In some applications, groups of the semiconductor embodiments 200, 500, 600 may be arranged in parallel and/or series connection configurations to further provide a voltage and/or current of interest. Thus, some semiconductor embodiments 200, 500, 600 may be configured to source low voltage and/or low current loads 400. Other semiconductor embodiments 200, 500, 600 may be configured to source high voltage and/or high current loads 104. Some embodiments may be configured to supplement, or even replace, power generation stations used in a public utility power grid or a private power system. Where waste heat is available, semiconductor embodiments 200, 500, 600 may be used for energy conservation, green power, and/or co-generation.

In a working semiconductor embodiment 600, a three inch wafer was fabricated using molecular beam epitaxy with 21 total layers (10.5 pairs), each 0.25 um thick, alternating 0.50 AlGaAs (50% Al) and 0.33 AlGaAs (30% Al) on an n-doped GaAs wafer. The top and bottom 10% (25 nm) of each layer were doped at 1.0E+18, with alternating doping at each heterojunction. Terminals 210, 212 were deposited on top and bottom of the finished wafer and annealed. Table 1 illustrates measured test performance results for the working semiconductor embodiment 600.

TABLE 1

| Temperature (F.) | Voltage (mV) | Current (uA) |
| --- | --- | --- |
| 250 | 0.026 | 0.04 |
| 300 | 0.051 | 0.11 |
| 350+/−25 (cyclical) | | 0.03 to 0.72 |
| 450+/−25 (cyclical) | | 0.27 to 1.95 |
| 550+/−25 (cyclical) | | 0.40 to 3.07 |

Generally, the division between indirect and direct semiconductor materials is at about 41-43%. Higher than that is indirect, lower is direct. The exact percentage AL number may vary based on temperature and fabrication. The exemplary embodiment was fabricated at substantially 50% AL and substantially 30% AL. In an alternative embodiment fabricated using AlGaAs, a percentage greater than 50% AL and lower than 33% AL may be employed.

The semiconductor embodiments 200, 500, 600 may be readily fabricated using any suitable semiconductor fabrication process. Further, any suitable semiconductor material may be used in fabrication of a direct thermal electric converter 100. Other non-limiting examples of semiconductor materials include, but are not limited to, Ge, $Hg_{1-x}Cd_xTe$, SiGe superlattice, $In_xGa_{1-x}Sb$, GaSb, PbS, PbSe, or PbTe. Indirect narrow-gap superlattice materials, including $In_xGa_{1-x}Sb/Bi_ySb_{1-y}$ may be used.

Even when two semiconductors are both direct (or indirect), they may still have different recombination rates. Of particular interest are narrow gap direct semiconductors with different effective Densities of States, indicating different recombination rates. The differing density of state values may be selectively used in the fabrication of the semiconductor layers to control output current and/or voltage. In particular, Lead Sulfide (PbS) and Lead Telluride (PbTe) have a significant differences (for example, a factor of 1.6) at ambient temperature. In general, any pair of materials with a narrow bandgap and unequal recombination rates which can be grown together in the structure may be used in a semiconductor embodiment 200, 500, 600.

Additionally, or alternatively, the thickness of the semiconductor layers and/or doping layers may be varied to control output current and/or voltage. In some embodiments, additional layers may be inserted between the materials, such as metal layers within the doped regions, without adversely affecting performance. In an exemplary embodiment, the heterojunction is centered between, or is substantially centered between, the doping layers 208a/b. In other embodiments, the heterojunction may not be centered. In some embodiments, the heterojunction may be located outside the doped layer 208a/b. In such embodiments, the ratio of carriers may remain dominated by the effects of doping. Also, in such embodiments, one of the doped layers 208a/b would be inherently omitted.

FIG. 6 is a block diagram of an alternative semiconductor embodiment 600 of the direct thermal electric converter 100. The semiconductor embodiment 600 comprises a plurality of alternating layers of a high recombination material 204 and a low recombination material 202 which are separated by either a positive doped layer 206a/b or a negative doped layer 208a/b. A positive terminal 210 and a negative terminal 212 provide attachment points for delivery of the generated DC electrical power. In alternative embodiments, a positive doped layer 214 and/or a negative doped layer 216 may be optionally included at the ends of the semiconductor embodiment 200 depending upon the material recombination type of the ending portions of the semiconductor materials.

FIG. 7 is a block diagram of an electrochemical embodiment 700 of the direct thermal electric converter 100. The electrochemical embodiment 700 comprises an enclosure 702 enclosing a plurality of alternating layers of a high recombination material 704 and a low recombination material. The low recombination material is cooperatively formed by an anion membrane 706 and a cation membrane 708 in contact with each other. A positive terminal 210 and a negative terminal 212 provide attachment points for delivery of the generated DC electrical power.

In an exemplary embodiment, the high recombination material 704 is water. Preferably, the water of the high recombination material 704 is pure, or substantially pure. In some embodiments, chemical additives may be added to adjust the recombination. Alternatively, or additionally, another type of high recombination fluid or material may be used for the high recombination material 704.

When heat energy is added to the electrochemical embodiment 700, positive charge carriers and negative charge carriers are generated in the low recombination material cooperatively formed by the anion membrane 706 and the cation membrane 708. The negative charge carriers migrating into the water from the cation membrane 708 recombine with the positively charged carriers migrating into the water from the anion membrane 706 located on the opposing side of the water.

In an exemplary electrochemical embodiment 700, the positive charge carriers are hydrogen ions (H+). The hydrogen ions migrate towards their respective high recombination material 704, the water. The negative charge carriers in the electrochemical embodiment 700 are hydroxyl ions (OH−). The hydroxyl ions also migrate towards their respective high recombination material 704, the water. Movement of these positively charged hydrogen ions, and the opposite movement of the hydroxyl ions, results in a net migration of charge across the electrochemical embodiment 700, thereby resulting in a current and a voltage. The hydrogen ions are opposite in polarity from the hydroxyl ions.

Any suitable anion exchange membrane material may be used for the anion membrane 706. Any suitable cation exchange membrane material may be used for the cation membrane 708. An exemplary working embodiment employed an AMI-7001S Anion exchange membrane sandwiched with a CMI-7002 Cation Exchange membrane. Nine membrane pairs were arranged in a tray 702 and distilled water was used as the high recombination material 704

In the exemplary embodiment, hydrogen was exhausted from the enclosure 702 in proximity to the positive terminal 210. In some embodiments, the enclosure 702 may be configured to capture the exhausting hydrogen for use in other chemical or electrochemical processes.

In the exemplary embodiment, oxygen was exhausted from the enclosure 702 in proximity to the negative terminal 212. In some embodiments, the enclosure 702 may be configured to capture the exhausting oxygen for use in other chemical or electrochemical processes.

In an electrochemical embodiment 700 utilizing water as the high recombination material 704, the exhausting hydrogen and oxygen deplete the water. Accordingly, water may have to be added from time to time to extend the useful life of the electrochemical embodiment 700.

Figure 8:
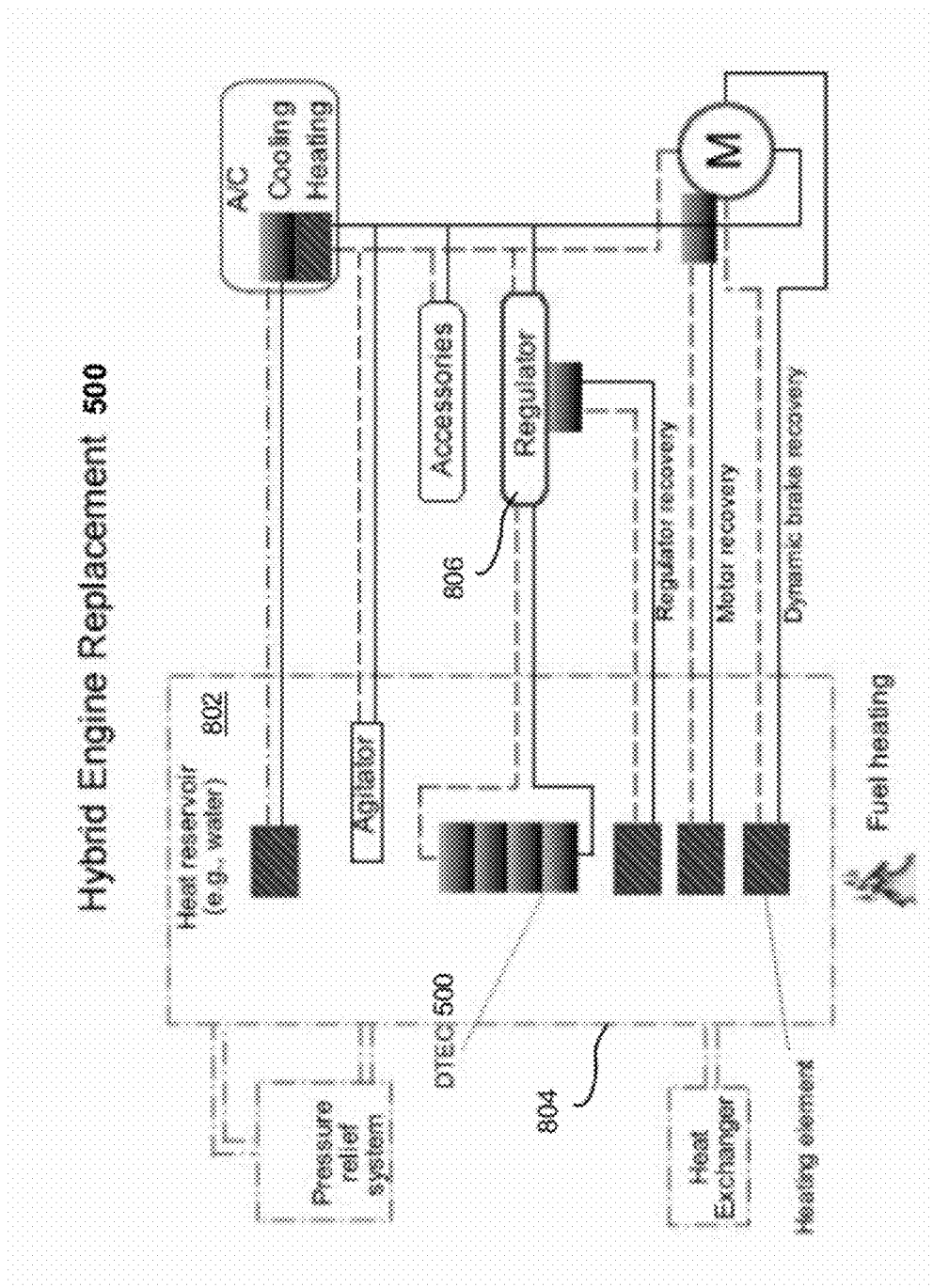
FIG. 8 is a diagram of a hybrid engine replacement embodiment.

FIG. 8 is a diagram of a hybrid engine replacement embodiment 800. The embodiment employs the semiconductor embodiment 500 of FIG. 5 that comprises alternating layers of a high recombination material 204 and a low recombination material 202 which are separated by either a positive doped layer 206a/b or a negative doped layer 208a/b (FIG. 5). The stacked layer semiconductor embodiment 500 is referred to herein as a direct thermal electric converter (DTEC) 500. The DTEC 500 may have any suitable size, configuration, and/or number of layers so as to be suitable for its intended operating purpose.

The hybrid engine replacement embodiment 800 is configured to supply on-demand power using the DTEC 500. The DTEC 500 is configured to convert the internal thermal energy in the hybrid engine replacement embodiment 800 into electrical power. The DTEC 500 provides electrical output from the hybrid engine replacement embodiment 800.

In some embodiments, a heat reservoir 802 provides heat storage. Storage can be a tank 804 containing water in an example embodiment. In an example embodiment, tank 804 can be low pressure vessel, limited to one atmosphere with up to roughly 0.4 MJ/kg, or high pressure, allowing higher pressures and more dense storage. Size and insulation of the tank 804 depends on application requirements. Soluble materials such as salt or anti-freeze may be present to extend the Device temperature range. Alternate storage materials (liquid sodium, bulk metal, compressed gas, etc.) are available depending on preferred operating temperature. Under some conditions, the local environment of the hybrid engine replacement embodiment 800 may be used as heat storage.

The hybrid engine replacement embodiment 800 may utilize any suitable heat source. If the hybrid engine replacement embodiment 800 is intended exclusively for storage, the Heat Source can be resistive heating elements. If the hybrid engine replacement embodiment 800 is intended for power generation, this can be any source of heat, including combustion, concentrated solar, waste heat, or a nuclear reactor. In an example embodiment, the heat source may be from ambient heat if power requirements are low enough. The heat source may also be waste or other source of undesirable heat resulting as a byproduct of other processes. Further, multiple heat sources may be used as available.

In an example embodiment, some method of forcing circulation may be required. Circulation could be performed by a sealed motor that is powered by the DTEC 500.

If output voltage and/or current regulation is required, a regulator 806 may optionally be in contact with the converter and heat storage, such that heat generated by the regulator 806 is retained within the system. In an example embodiment, the regulator 806 can employ Zener diodes to voltage regulators or switching power supplies.

In an example embodiment, the tank 804 may require a valve or the like to prevent damage from overheating and the resulting overpressure.

In an example embodiment, thermal regulation for control of applied heat from source may be required to prevent damage to storage or regulate temperature of the heat source. In an example embodiment, in applications where heat from the heat source is waste or otherwise is an undesirable byproduct of other processes, additional heat dissipation may be used to radiate, vent or otherwise expel heat into the local environment to prevent damage to components of the hybrid engine replacement embodiment 800.

Example applications of embodiments of the hybrid engine replacement embodiment 800 are listed herein below.

- Power storage using heat accumulated and stored in the tank 804 or another storage medium.
- Drop-in replacement for automobile hybrid engines, including the motor and the battery pack. This example embodiment may optionally include both burners for fuel and heating coils from dynamic braking.
- Power-plant generation facility replacement or retrofit.
- Medical implant power: In an example embodiment, heat storage might be minimized if peak requirements are very close to typical output when operating at a human's internal temperature.
- Alkaline battery replacement: In an example embodiment, an integrated Zener diode could serve as voltage regulation.
- Microprocessor or other integrated circuit cooling unit. In an example embodiment, the microprocessor may be at least one heat source, and the substrate may be the part of the heat storage system.
- Permanent sealed motor: In an example embodiment, a motor may be immersed in a liquid to be propelled or circulated by the motor. The liquid may be used as heat storage, and heat from the motor may be part of the heat source.

Refrigeration: In an example embodiment, the heat source may be a material, unit or volume under refrigeration. External dissipation may be used to effectively transfer heat to the local environment.

Active Insulation: In an example embodiment, an insulating material with both DTECs 500 and with heat dissipation on one or both sides of the insulating material, such that the temperature on one side of the material, may be maintained regardless of the temperature on the other side. Additional controls may be added to allow maintenance of temperature further removed from the embodiment.

Thermo-reactive materials: A DTEC 500 may be integrated into a material such that the electrical output changes the properties of the material in response to temperature. One such combination would be with Liquid Crystals, such that the material turns opaque at a certain temperature.

Permanent Power Source: A DTEC 500 may be integrated into a device to provide permanent power. In this case, the heat source may be ambient and heat storage may be the device itself.

In an example embodiment where the hybrid engine replacement embodiment 800 is a replacement for a Hybrid Engine, the hybrid engine replacement embodiment 800 may resemble a dual-source gas/electric water heater. Methane, Propane or other combustible material would provide heat when tank temperature drops below target operating temperature. Electricity from dynamic braking could also be used to heat the tank. If regulation is required, the regulator (or Switching Power Supply) should be located inside the tank so that dissipated heat from regulation is retained within the system. Vehicle air conditioning could also be designed to dissipate heat into the tank. Additionally, it may be beneficial to select Converters with a low enough operating temperature that under some conditions it becomes possible to draw heat from ambient, temporarily alleviating the need to consume fuel. Care should be taken to prevent system from freezing in extreme cold, including restricting drive power when system approaches lower limits of Anti-Freeze.

Figure 9:
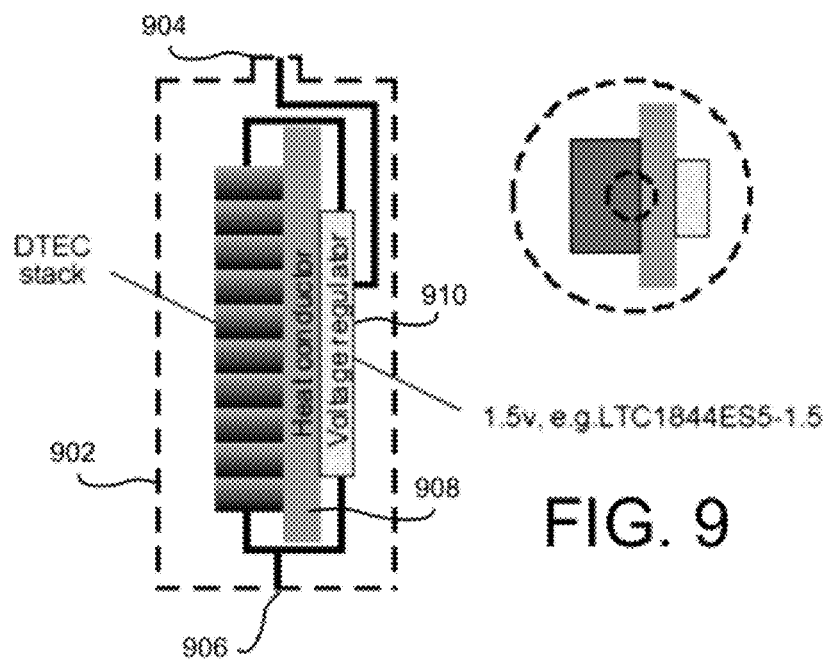
FIG. 9 is a diagram of a battery replacement embodiment.
Figure 10:
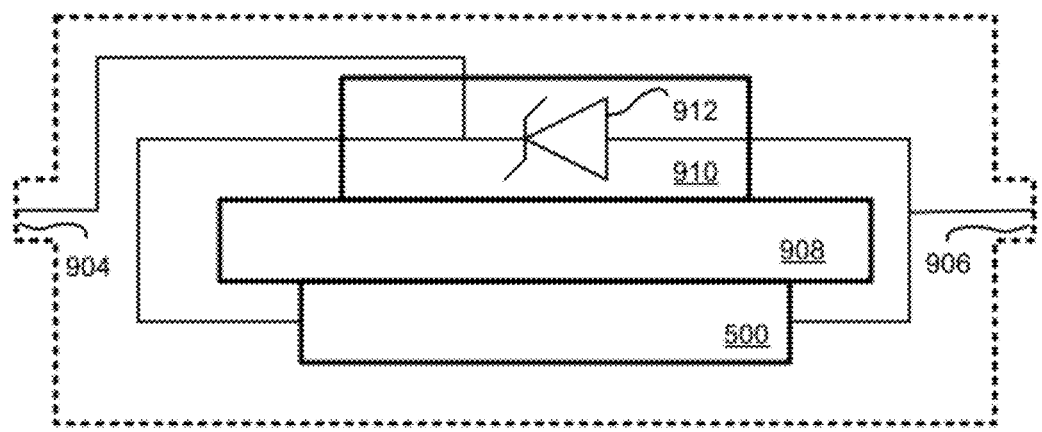
FIG. 10 is a block diagram of the battery replacement embodiment of FIG. 9.

In an example embodiment, a drop-in replacement for automobile hybrid engines includes a motor and a battery pack. An example embodiment may include both burners for fuel and heating coils from dynamic braking. A replacement for a Hybrid Engine most resembles a dual-source gas/electric water heater. Methane, Propane or other combustible material would provide heat when tank temperature drops below target operating temperature. Electricity from dynamic braking could also be used to heat the tank. If regulation is required, the regulator (or Switching Power Supply) could be located inside the tank, or with integrated Converter (104) so that dissipated heat from regulation is retained within the system. Vehicle air conditioning could also be designed to dissipate heat into the tank. Additionally, it may be beneficial to select Converter 104 with a low enough operating temperature that under some conditions it becomes possible to draw heat from ambient, temporarily alleviating the need to consume fuel. Care should be taken to prevent system from freezing in extreme cold, including restricting drive power when system approaches lower limits of Anti-Freeze. Peak output requirements may be reduced by incorporating a secondary storage device such as a battery, capacitor bank or hydraulic accumulator with sufficient capacity to accelerate the vehicle to speed once FIG. 9 is a diagram of a battery replacement embodiment 900. FIG. 10 is a block diagram of the battery replacement 900 of FIG. 9. The battery replacement embodiment 900 may be encased in a housing 902 that has a positive terminal 904 and a negative terminal 906. The housing 902 and terminals 904, 906 may be configured in any suitable size and/or configuration so as to readily replace any type of battery. That is, the housing 902, the positive terminal 904 and the negative terminal 906 cooperatively emulate a battery.

Power is provided by the DTEC 500 using heat from a heat conductor 908 that receives heat from a heat source (not shown). Output voltage and/or current may be controlled by a regulator 910. The converter 910, also referred to as a voltage regulator, should be sized to provide the rated current and voltage across the rated operating temperature range. In an example embodiment, the regulator employs a Zener diode 912 (FIG. 10), though any suitable voltage and/or current regulation circuitry may be used in other embodiments. If a Zener Diode 212 is used, the breakdown voltage of Zener Diode 212 should be the rated output voltage.

Various means may be used by the housing 902 for affixing directly to a heat source. In an example embodiment, the housing 902 may be expanded with thermally conductive material, and incorporating a heat storage medium such as water.

In an example embodiment, the regulator 910 may include command signals or set-points, and may be set to regulate temperature instead of output voltage.

In an example embodiment, the primary challenge in an Alkaline Battery Replacement is that DTEC 500 has a peak voltage that is higher than the maximum desired power output voltage of the battery. Typical applications expect peak power at near peak voltage. The solution is integrated voltage regulation that may be achieved with either a Voltage Regulator 902 and/or a Zener diode 912 (FIG. 10) across the outputs. Additionally, any waste heat from regulation may be recovered by the DTEC 500.

In an example embodiment, the DTEC 500 may be used in place of, or to supplement, turbines in thermal power plants. For steam-based power generation plants, it may be beneficial to incorporate the DTECs directly into tanks. In general, design should strive to minimize heat losses so that heat is available for conversion into power by the DTECs 500. In an example embodiment, storage tanks with Battery Replacement 100 units could replace cooling ponds. Once cooled, the water could be fed back into the cold side of the heat exchangers. This could be used to store heat within the tanks as needed for peak power In an example embodiment, the DTECs 500 may be employed for refrigeration. Consideration for cooling applications is where to dispose of the power. Options for disposing of generated power include:

Local loads, especially microprocessors. In an example embodiment, the power is fed back to the device generating heat. Care should be taken that the temperature remains above ambient to prevent condensation.

Remote loads, such as air conditioners. In an example embodiment of a fixed installation where power grid access is available, generated power may be supplied to the power grid.

Local environment, such as ice chests. In an example embodiment, heat may be dissipated with a heating element and/or fan. Alternatively, or additionally, heat may be dissipated through the entire surface of the container. In the latter case, once the refrigeration unit has achieved stable temperature internally, the net heat dissipation through the surface will be zero. That is to say, the Converters will only be converting heat that leaked through the insulation. Moving heat back outside the insulation will have no net effect beyond the unit. This same model applies to "Active Insulation."

Storage. Power may be stored locally or remotely for later use.

In an example embodiment, a permanent sealed motor may be used. Where the motor is immersed in a liquid to be propelled or circulated by the motor such that all waste heat (including from agitating the liquid) may be recovered.

In an example embodiment, thermo-reactive materials may be used. The DTEC 500 may be integrated into a material such that the electrical output changes the properties of the material in response to temperature. One such combination would be with Liquid Crystals, such that the material turns opaque at a certain temperature.

In an example embodiment, the DTEC 500 may be used for distillation. A conventional steam distillation system uses heat exchangers to recover much of the energy used in distillation. DTEC 500 on the output ports (product and residue) could be used to reduce the output temperature to or below ambient, allowing the system to operate with little or no external power. This approach could also be used for fractional distillation of other fluids or fluid mixtures.

For permanent power source applications requiring small amounts of power, and/or applications surrounded by a sufficiently warm environment, DTECs 500 may provide a permanent power source. If the incorporating device is exposed to air, condensation may be an issue to address at the device level. Conformal and Hydrophobic coatings may be beneficial. Permanent power source applications may include:

Permanent lights (with integrated LEDs)
Permanent motors (including for circulating warm material)
Small personal devices (including music players, watches, cell phones)
Medical implants (subject to safety testing, as DTECs may contain toxic materials and may degrade over time in some environments).

Figure 11:
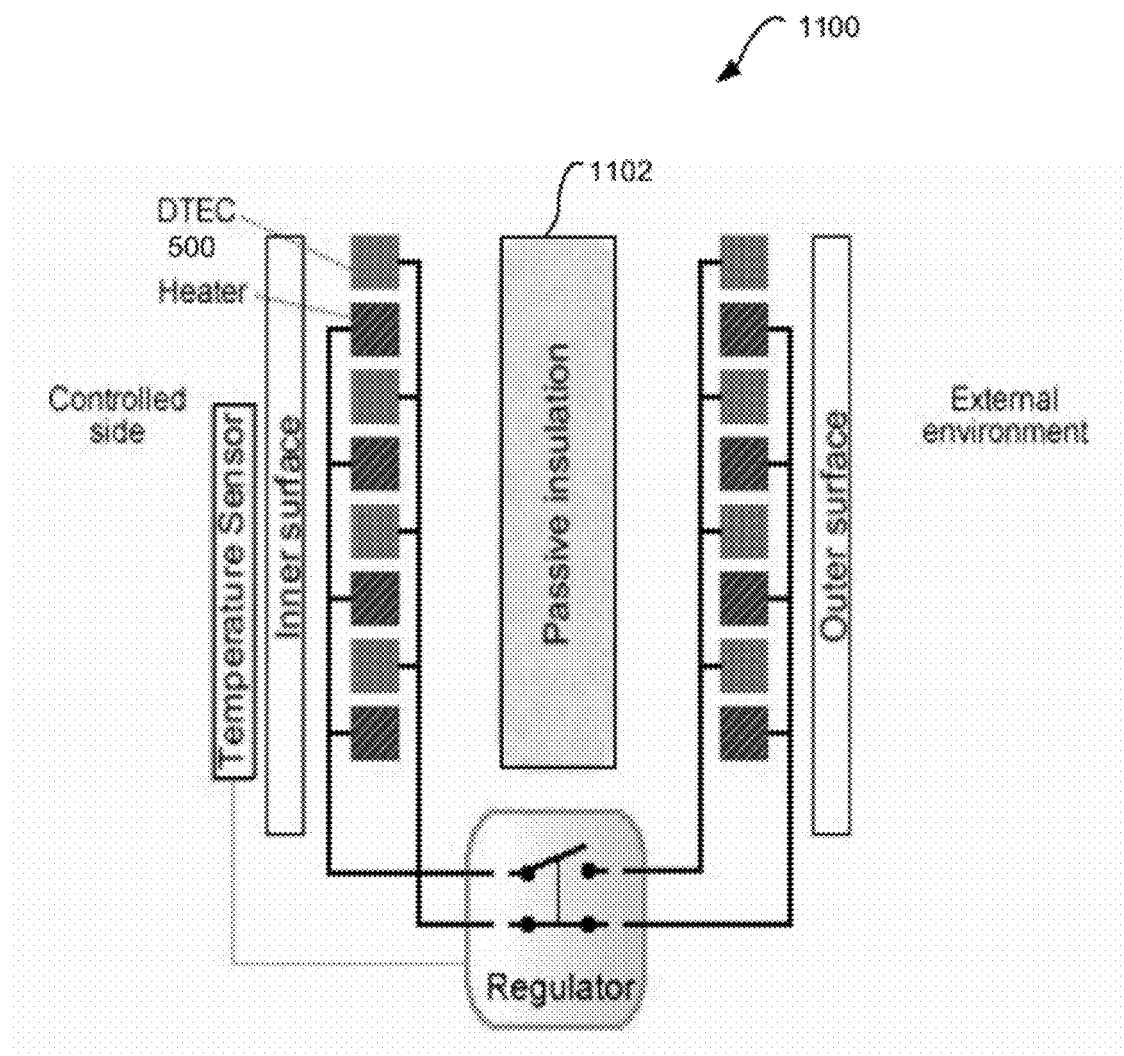
FIG. 11 is a diagram of an insulation-based embodiment.

FIG. 11 is a diagram of an insulation-based embodiment 1100. This embodiment employs insulation 1102. The DTECs 500 are on one or both sides of the insulation 1102. The temperature on one side of the insulating material of the insulation 1102 may be maintained regardless of the temperature on the other side of the insulation 1102. Additional controls could be added to allow maintenance of temperature further removed from the insulation-based embodiment 1100.

It should be emphasized that the above-described embodiments of the direct thermal electric converter 100 are merely possible examples of implementations of the invention. Many variations and modifications may be made to the above-described embodiments. All such modifications and variations are intended to be included herein within the scope of this disclosure and protected by the following claims.

The invention claimed is:

1. A direct thermal electric converter battery, comprising:
a housing with a positive terminal and a negative terminal;
a regulator that controls at least output voltage; and
a direct thermal electric converter (DTEC), comprising:
a first recombination material having a first recombination rate;
a second recombination material adjacent to the first recombination material and having a second recombination rate, wherein the second recombination rate is different from the first recombination rate; and
a third recombination material adjacent to the second recombination material and having a third recombination rate substantially the same as the first recombination rate,
wherein application of heat generates at least first charge carriers that migrate between the first recombination material and the second recombination material,
wherein the application of heat generates at least second charge carriers that migrate between the third recombination material and the second recombination material, wherein the second charge carriers are opposite in polarity from the first charge carriers, and
wherein the migration of the first charge carriers and the migration of the second charge carriers generates an electrical current,
wherein the housing, the positive terminal and the negative terminal cooperatively emulate a battery, wherein the first recombination material and the third recombination material are a low recombination material, and wherein the second recombination material is a high recombination material; wherein the first recombination material and the second recombination material join at a first heterojunction, and wherein the second recombination material and the third recombination material join at a second heterojunction: wherein the first recombination material comprises: a negatively doped semiconductor layer adjacent to the first heterojunction; and a low recombination semiconductor material layer adjacent to and on an opposing side of the negatively doped semiconductor layer of the first recombination material; wherein the second recombination material comprises: a negatively doped semiconductor layer adjacent to the first heterojunction; a positively doped semiconductor layer adjacent to the second heterojunction; and a high recombination semiconductor layer between the negatively doped semiconductor layer of the second recombination material and the positively doped semiconductor layer of the second recombination material; wherein the third recombination material comprises: a positively doped semiconductor layer adjacent to the second heterojunction; and a low recombination semiconductor material adjacent to and on an opposing side of the positively doped semiconductor layer of the third recombination material, where in response to receiving heat, electrons are generated at least within the low recombination semiconductor material layer of the first recombination material, wherein the electrons migrate through the negatively doped semiconductor layers of the first and the second recombination materials, where in response to receiving heat, holes are generated at least within the low recombination semiconductor material layer of the third recombination material, wherein the holes migrate through the positively doped semiconductor layers of the third and the second recombination materials, and wherein the migration of the electrons and the migration of the holes generate electrical current.

2. The direct thermal electric converter battery of claim 1, wherein the first heterojunction is centered between the negatively doped semiconductor layer of the first recombination material and the negatively doped semiconductor layer of the second recombination material.

3. The direct thermal electric converter battery of claim 1, wherein the second heterojunction is centered between the positively doped semiconductor layer of the second recombination material and the positively doped semiconductor layer of the third recombination material.

4. The direct thermal electric converter battery of claim 1, wherein a thickness of the negatively doped semiconductor layer of the first recombination material is different from a thickness of the negatively doped semiconductor layer of the second recombination material.

5. The direct thermal electric converter battery of claim 1, wherein the first recombination material and the third recombination material comprise AlGaAs with substantially 50% Al, and wherein the second recombination material comprises AlGaAs with substantially 30% Al.

6. The direct thermal electric converter battery of claim 1, further comprising:
- a fourth recombination material adjacent to the first recombination material and having a fourth recombination rate substantially the same as the second recombination rate; and
- a fifth recombination material adjacent to the fourth recombination material and having a fifth recombination rate substantially the same as the first recombination rate,
- wherein application of heat generates at least first charge carriers that migrate between the fifth recombination material and the fourth recombination material,
- wherein the application of heat generates at least second charge carriers that migrate between the fourth recombination material and the first recombination material.

* * * * *